(12) United States Patent
Ching et al.

(10) Patent No.: US 8,143,699 B2
(45) Date of Patent: Mar. 27, 2012

(54) DUAL-DIELECTRIC MIM CAPACITORS FOR SYSTEM-ON-CHIP APPLICATIONS

(75) Inventors: Kuo-Cheng Ching, Zhubei (TW); Kuo-Chi Tu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 89 days.

(21) Appl. No.: 12/618,021

(22) Filed: Nov. 13, 2009

(65) Prior Publication Data

US 2010/0213572 A1    Aug. 26, 2010

Related U.S. Application Data

(60) Provisional application No. 61/155,343, filed on Feb. 25, 2009.

(51) Int. Cl.
*H01L 29/92* (2006.01)

(52) U.S. Cl. .......... 257/532; 257/303; 257/E29.343

(58) Field of Classification Search .......... 257/532, 257/303, E29.343
See application file for complete search history.

(56) References Cited

U.S. PATENT DOCUMENTS

| | | | |
|---|---|---|---|
| 6,362,056 B1 | 3/2002 | Tonti et al. | |
| 6,362,606 B1 | 3/2002 | Dupuis et al. | |
| 6,392,488 B1 | 5/2002 | Dupuis et al. | |
| 6,462,620 B1 | 10/2002 | Dupuis et al. | |
| 6,472,721 B2 | 10/2002 | Ma et al. | |
| 6,518,151 B1 | 2/2003 | Dobuzinsky et al. | |
| 6,696,351 B1* | 2/2004 | Kuroda | 438/450 |
| 6,822,283 B2 | 11/2004 | Lin et al. | |
| 6,999,298 B2 | 2/2006 | Hackler, Sr. et al. | |
| 7,829,410 B2* | 11/2010 | Plum | 438/244 |
| 2002/0003280 A1* | 1/2002 | Kohyama | 257/529 |
| 2006/0157854 A1* | 7/2006 | Takewaki et al. | 257/758 |
| 2006/0292812 A1* | 12/2006 | Jung et al. | 438/381 |
| 2009/0134491 A1* | 5/2009 | Plum | 257/532 |
| 2009/0140386 A1* | 6/2009 | Inoue et al. | 257/532 |
| 2009/0224363 A1* | 9/2009 | Yoshida | 257/532 |
| 2010/0140743 A1* | 6/2010 | Sashida | 257/532 |
| 2011/0095349 A1* | 4/2011 | Hachisuka et al. | 257/303 |

OTHER PUBLICATIONS

Miyashita, K., et al., "A High Performance 100 nm Generation SOC Technology [CMOS IV] for High Density Embedded Memory and Mixed Signal LSIs," IEEE, Symposium on VLSI Technology Digest of Technical Papers, 2001, 2 pages.

(Continued)

*Primary Examiner* — Victor A Mandala
(74) *Attorney, Agent, or Firm* — Slater & Matsil, L.L.P.

(57) ABSTRACT

An integrated circuit structure includes a chip having a first region and a second region. A first metal-insulator-metal (MIM) capacitor is formed in the first region. The first MIM capacitor has a first bottom electrode; a first top electrode over the first bottom electrode; and a first capacitor insulator between and adjoining the first bottom electrode and the first top electrode. A second MIM capacitor is in the second region and is substantially level with the first MIM capacitor. The second MIM capacitor includes a second bottom electrode; a second top electrode over the second bottom electrode; and a second capacitor insulator between and adjoining the second bottom electrode and the second top electrode. The second capacitor insulator is different from the first capacitor insulator. The first top electrode and the first bottom electrode may be formed simultaneously with the second top electrode and the second bottom electrode, respectively.

21 Claims, 8 Drawing Sheets

OTHER PUBLICATIONS

Schiml, T., et al., "A 0.13 μm CMOS Platform with Cu/ Low-k Interconnects for System on Chip Applications," IEEE, Symposium on VLSI Technology Digest of Technical Papers, 2001, pp. 101-102.

Mahnkopf, K.-H., et al., "System on a Chip' Technology Platform for 0.18 μm Digital, Mixed Signal & eDRAM Applications," IEDM, 1999, pp. 35.2.1-35.2.4.

Lin, C.C., et al., "A Full Cu Damascene Metallization Process for Sub-0.18 μm RF CMOS SoC High Q Inductor and MIM Capacitor Application at 2.4GHz and 5.3GHz," IEEE, 2001, pp. 113-115.

Stein, K., et al., "High Reliability Metal Insulator Metal Capacitors for Silicon Germanium Analog Applications," IEEE BCTM, vol. 12.2, 1997, pp. 191-194.

Ng, C.H., et al., "MIM Capacitor Integration for Mixed-Signal/RF Applications," IEEE Transactions on Electron Devices, vol. 52, No. 7, Jul. 2005, pp. 1399-1409.

Kume, I., et al., "Low-Temperature Plasma-Oxidation Process for Reliable Tantalum-Oxide (TaO) Decoupling Capacitors," IEEE, 2008, pp. 225-227.

* cited by examiner

DUAL-DIELECTRIC MIM CAPACITORS FOR SYSTEM-ON-CHIP APPLICATIONS

This application claims the benefit of U.S. Provisional Application No. 61/155,343 filed on Feb. 25, 2009, entitled "Dual-Dielectric MIM Capacitors for System-on-Chip Applications," which application is hereby incorporated herein by reference.

TECHNICAL FIELD

This invention relates generally to capacitors, and more particularly to structures and fabrication methods of metal-insulator-metal (MIM) capacitors having different capacitor insulators in different regions of chips.

BACKGROUND

Metal-insulator-metal (MIM) capacitors have been widely used in functional circuits such as mixed signal circuits, analog circuits, radio frequency (RF) circuits, dynamic random access memory (DRAM), embedded DRAM, and logic operation circuits. In system-on-chip applications, different capacitors for different functional circuits have to be integrated on a same chip to serve different purposes. For example, in mixed signal circuits, capacitors are used as decoupling capacitors and high-frequency noise filters. For DRAM and embedded DRAM circuits, capacitors are used for memory storage; while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

With the capacitors having different functions formed in different metal layers, the capacitors may work under different operation voltages. For example, when used as decoupling capacitors, the capacitors need to be able to sustain high voltages. Therefore, the capacitor insulators need to be thick. In DRAMs, on the other hand, the operation voltage is low, and the capacitors need to be small in order to increase the DRAM cell density. Therefore, the capacitor insulators need to be thin.

The conventional capacitor integration scheme, however, suffers from drawbacks. With the capacitors for different functions formed in different layers, the capacitors in one metal layer need to have their own formation process that cannot be shared by other capacitors in different layers. For example, the bottom electrodes, the insulators, and the top electrodes in one metal layer have to be formed separately from the bottom electrodes, the insulators, and the top electrodes, respectively, of other capacitors in different layers. This significantly increases the cost and process complexity.

SUMMARY OF THE INVENTION

In accordance with an embodiment of the present invention, an integrated circuit structure includes a chip having a first region and a second region. A first metal-insulator-metal (MIM) capacitor is formed in the first region. The first MIM capacitor has a first bottom electrode; a first top electrode over the first bottom electrode; and a first capacitor insulator between and adjoining the first bottom electrode and the first top electrode. A second MIM capacitor is in the second region and is substantially level with the first MIM capacitor. The second MIM capacitor includes a second bottom electrode; a second top electrode over the second bottom electrode; and a second capacitor insulator between and adjoining the second bottom electrode and the second top electrode. The second capacitor insulator is different from the first capacitor insulator either in material or thickness, or both. The first top electrode and the first bottom electrode may be formed simultaneously with the second top electrode and the second bottom electrode, respectively. Other embodiments are also disclosed.

The advantageous features of the present invention include reduced process steps and complexity, improved reliability, and reduced chip-area usage in the formation of capacitors having different functions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention, and do not limit the scope of the invention.

It is realized that for a system-on-chip (SoC) application, different functional capacitors may be needed in different functional regions (circuits), such as a mixed signal region, an analog region, a radio frequency (RF) region, a dynamic random access memory (DRAM) region, a logic region, and a static random access memory (SRAM) region. To reduce the manufacturing cost and to reduce the process complexity, all these capacitors may be manufactured simultaneously in a same level, for example, in a same metal layer. Accordingly, all of the insulators in the capacitors have a same thickness and are formed of a same material. However, this results in a dilemma. For example, in order to accommodate the high voltage in the mixed signal regions, the analog regions, or the like, the decoupling capacitors need to have thick capacitor insulators. However, thicker capacitor insulators result in smaller capacitance per unit chip-area. As a result, DRAM capacitors, which may have high densities, are forced to occupy greater chip areas. Conversely, to suit the high-density requirement of the DRAM capacitors, the capacitor insulators need to be thin. This, however, means that the reliability of the capacitors in the mixed signal region and the analog region may be sacrificed due to the reduced insulator thickness.

To solve the above-discussed dilemma, a novel integration scheme for integrating different functional metal-insulator-metal (MIM) capacitors on a same SoC chip and the corresponding structures are provided. As is known in the art, a MIM capacitor may be a capacitor having a stacked structure, for example, including a bottom electrode, a top electrode, and an insulator therebetween. The intermediate stages of manufacturing exemplary embodiments of the present invention are also illustrated. Throughout the various views and illustrative embodiments of the present invention, like reference numbers are used to designate like elements.

Figure 1:
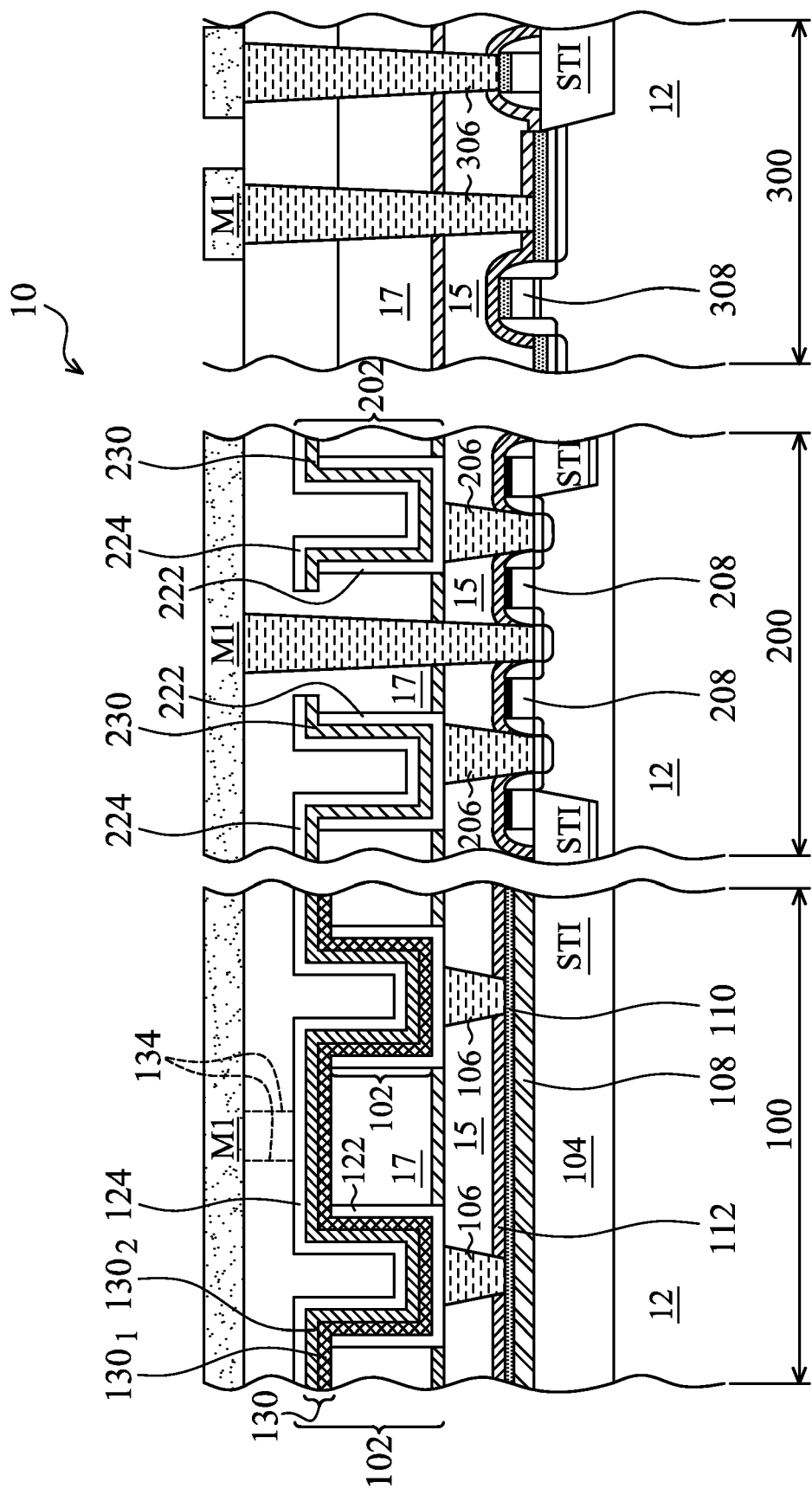
FIGS. 1 through 4 illustrate embodiments of the present invention, wherein capacitors in different regions have different capacitor insulators.

FIG. 1 illustrates an embodiment of the present invention. Semiconductor chip 10, which will have system-on-chip (SoC) applications built therein, is provided. Chip 10 includes region 100, region 200, and region 300. In an embodiment, region 100 may be a mixed signal region, an analog region, a radio frequency (RF) region, or a combined region including more than one of these regions. Region 200 may be a DRAM region. Region 300 may be a logic region having core (logic) devices, a static random access memory (SRAM) region, or a combined region including both logic and SRAM circuits. Chip 10 includes substrate 12 that expands through regions 100, 200, and 300. Substrate 12 may be a silicon substrate, or a substrate comprising other semiconductor materials, such as group III, group IV, and/or ground V elements. Layers 15 and 17 are inter-layer dielectrics (ILD)

In region 100, capacitors 102 are formed. Shallow trench isolation (STI) region 104 is formed in substrate 12 and vertically overlaps capacitors 102, wherein the area of STI region 104 is preferably greater than, although it may also be equal to or slightly less than, the area of capacitors 102. In an embodiment, STI region 104 fully vertically overlaps all of the overlying capacitors 102, and may further expand beyond the edges of capacitors 102 in lateral directions (the directions parallel to the surface of substrate 12). In other embodiments, STI region 104 has an area greater than about 90 percent of the area of capacitors 102. In an embodiment, capacitors 102 are formed in ILD 17, which is lower than the bottom metallization layer (commonly known as M1). Please note that ILD 17 may be the dielectric layer in which gates 208 and 308 of transistors are formed. In this case, capacitors 102 are connected to contact plugs 106, which may be formed of tungsten. In region 100, polysilicon strip 108 is formed. Silicide 110 is formed on polysilicon strip 108 by a silicidation process. Contact etch stop layer (CESL) 112 is formed on silicide 110. Polysilicon strip 108, silicide 110, and CESL 112 may be formed simultaneously, and hence comprise the same materials as gates 208 and 308, gate silicides and source (or drain) silicides, and the CESLs in regions 200 and 300, respectively. Similarly, the illustrated contact plugs 106, 206, and 306 may be formed simultaneously using a same conductive material. It is noted that capacitors 102 may have their bottom electrodes 122 interconnected through contact plugs 106 and silicide 110, and their top electrodes 124 interconnected by themselves. As a result, capacitors 102 may act as a single capacitor. Throughout the description, bottom electrodes 122 and other bottom electrodes and top electrodes may be formed of titanium nitride (TiN) or combinations of titanium (Ti) with titanium nitride, tantalum nitride (TaN), tungsten (W), tungsten nitride (WN), ruthenium (Ru), iridium (Ir), and platinum (Pt). Generally, low-resistivity materials may be used.

Capacitors 202 are formed in IDL 17 of region 200, and may be used as the storage capacitors of DRAM cells. The bottom electrodes 122 and 222 may be formed simultaneously, and hence are formed of a same conductive material and have a same thickness. Further, the top electrodes 124 and 224 are formed simultaneously, and hence are formed of a same conductive material and have a same thickness. Capacitors 102 and 202 comprise vertical portions (sidewall portions) and horizontal portions (bottom portions), and hence are also referred to as three-dimensional (3D) capacitors, since capacitors 102 and 202 not only extend in the direction parallel to the top surface of substrate 12, but also in a vertical direction perpendicular to the top surface of substrate 12. This advantageously increases the capacitance per unit chip-area.

In alternative embodiments, capacitors 102 and 202 are formed in layers higher than ILD 17, for example, in any of the dielectric layers known as inter-metal dielectrics (IMDs), which are commonly known in the art as being the dielectric layers for forming metal lines and vias therein. Further, the IMDs are higher than metallization layer M1. However, it is advantageous to form capacitors 102 and 202 in ILD layer 17, partially for the improved performance of the DRAM cells. Capacitors 102 may be used as the capacitors for mixed signal circuits, analog circuits, and/or RF circuits. Conventionally, it was not desirable to form capacitors 102 in ILD 17, which is close to substrate 12, because the signal loss in substrate 12 would be high. However, in embodiments of the present invention, STI region 104 is formed directly underlying capacitors 102, and hence the signal loss is reduced, making it possible to form capacitors 102 in ILD 17 without causing excess signal loss. On the other hand, a substantial portion, for example, greater than about 20 percent, and possibly greater than about 50 percent of capacitor 202 has no STI region directly underlying.

In an embodiment of the present invention, as shown in FIG. 1, capacitors 102 include capacitor insulator 130 between, and contacting, bottom electrode 122 and top electrode 124. Unless specified otherwise, insulator 130 and other insulators discussed in the specification may include silicon dioxide ($SiO_2$), silicon nitride ($Si_3N_4$), aluminum oxide ($Al_2O_3$), hafnium silicates (HfSiON), tantalum oxide ($Ta_2O_5$), zirconium oxide ($ZrO_2$), hafnium oxide ($HfO_2$), titanium oxide ($TiO_2$), barium strontium titanate oxide (BST), strontium titanate oxide (STO), and combinations thereof. Capacitor 202 includes capacitor insulator 230 between, and contacting, respective bottom electrode 222 and top electrode 224. Each capacitor insulator 130 includes layer $130_1$ and layer $130_2$, wherein layer $130_1$ is formed simultaneously as, and hence comprises a same material, and has a same thickness, as capacitor insulator 230. Capacitors 202, however, do not include any layer that is formed simultaneously with layer $130_2$. Accordingly, capacitors 102, with two dielectric layers stacked together, have a greater breakdown voltage, and hence improved reliability. This is particularly desirable since the voltages applied to capacitors 102 are often high, for example, when used as decoupling capacitors with one of the bottom electrode 122 and top electrode 124 connected to voltage VDD, and the other one connected to voltage VSS. In FIG. 1, dotted lines 134 illustrate a contact connecting top electrode 124 to a M1 metal line. In this case, the M1 metal line may be a VDD power line or a VSS power line.

Each capacitor 202, on the other hand, has only one dielectric layer, and hence can endure lower operation voltage than capacitors 102, and therefore may be used in low voltage applications. With thin capacitor insulators, capacitors 202 have a high capacitance per unit chip-area. This is desirable since a DRAM array may include many storage capacitors, and hence the increased capacitance per unit chip-area is advantageous for increasing the density of the DRAM array. Again, region 300 may be a logic region having core (logic) devices, a static random access memory (SRAM) region, or a combined region including both logic and SRAM circuits.

Figure 2:
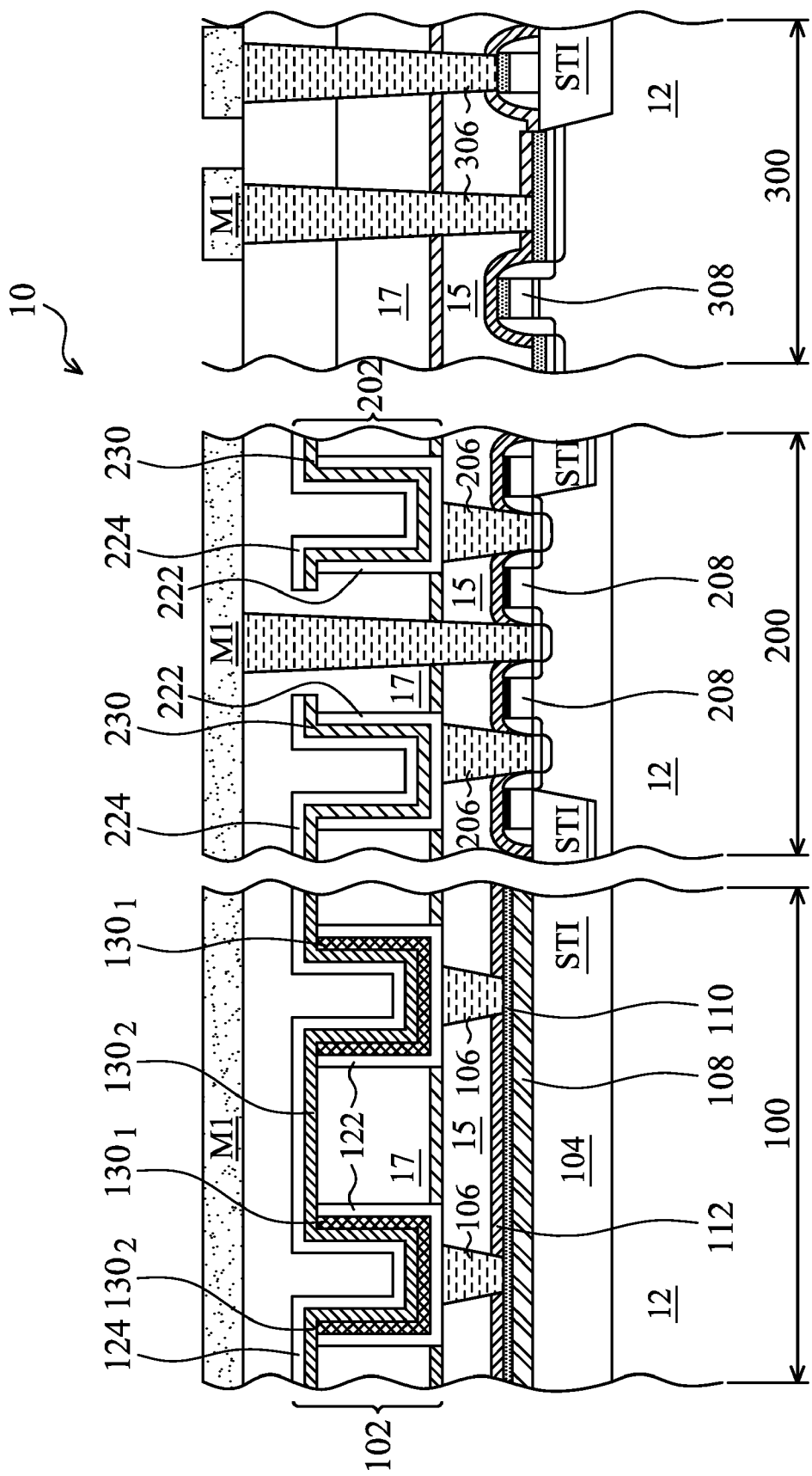

In FIG. 1, both capacitor insulator layers $130_1$ and $130_2$ extend from one of the capacitors 102 to the other. FIG. 2 illustrates an alternative embodiment of the present invention, with like elements in FIGS. 1 and 2 being illustrated using like reference numerals. The embodiment shown in FIG. 2 is similar to the embodiment shown in FIG. 1, except the capacitor insulator layers $130_1$ of capacitors 102 are separated from each other. In other words, insulator layers $130_1$ of the two illustrated capacitors 102 are limited in the respective crown regions (the cup-shaped recesses). The capacitor insulator layers $130_2$ of capacitors 102, however, are still connected through a portion directly over ILD 17 to form a continuous region. Embodiments shown in FIGS. 1 and 2 may be used in different situations to suit for different materials.

Figure 3:
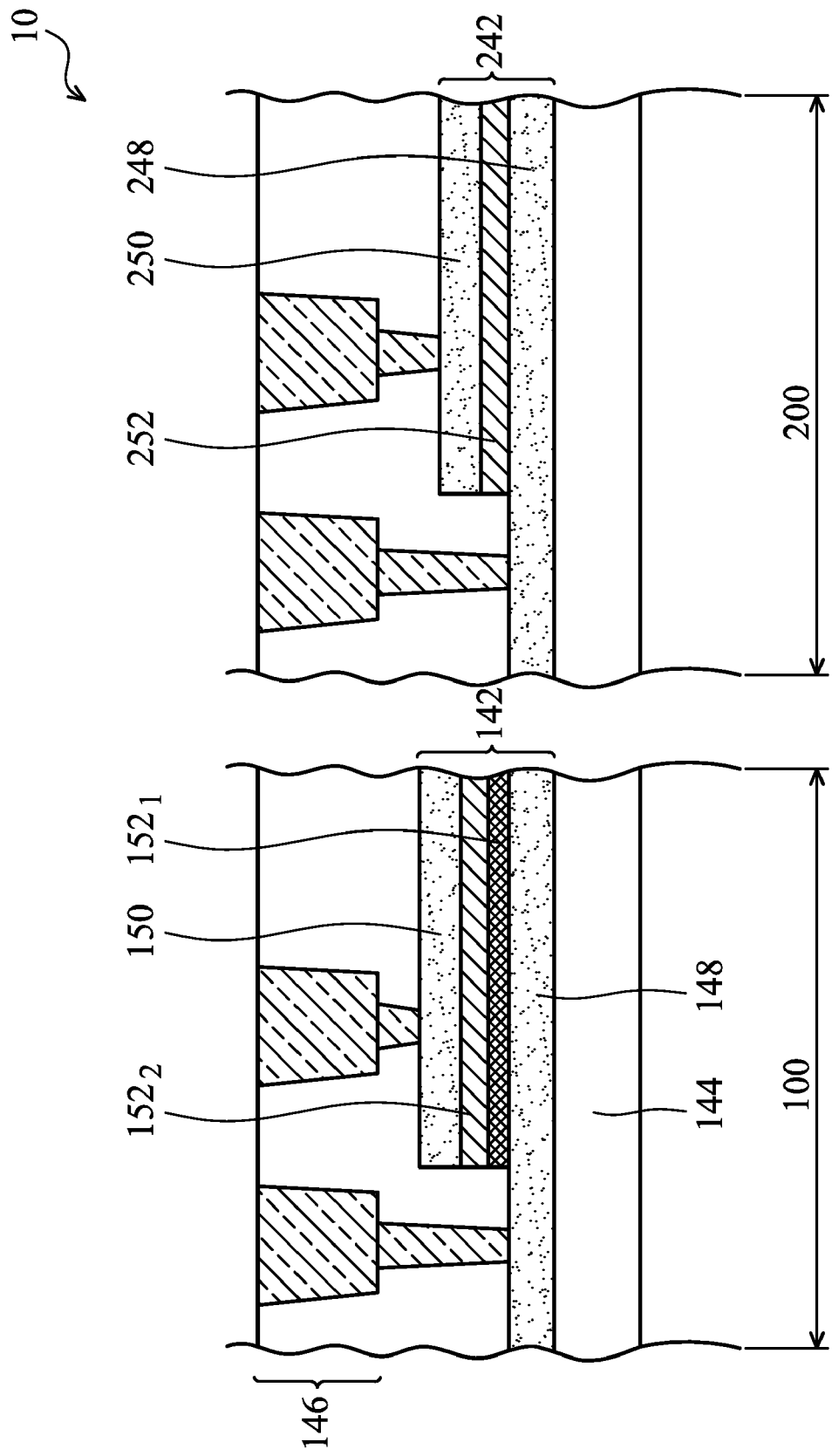

FIG. 3 illustrates another embodiment of the present invention. In this case, capacitors 142 and 242 may be formed in any of the metal layers and between two neighboring copper layers 144 and 146, wherein the metal layers may range from the bottom metal layer (M1, refer to FIGS. 1 and 2) to the top metal layer (Mtop, not shown). Similarly, bottom electrodes 148 and 248 are formed simultaneously, and hence are formed of a same conductive material. Further, top electrodes 150 and 250 are formed simultaneously, and hence are formed of a same conductive material. In an embodiment, capacitor 142 includes capacitor insulator 152 (denoted as $152_1$ and $152_2$) between, and contacting, bottom electrode 148 and top electrode 150. Capacitor 242 includes capacitor insulator 252 between, and contacting, bottom electrode 248 and top electrode 250. Capacitor insulator 152 includes layer $152_1$ and layer $152_2$, wherein layer $152_2$ is formed simultaneously with capacitor insulator 252. Capacitors 242, however, do not include any capacitor insulator that is formed simultaneously with capacitor insulator $152_1$. Capacitors 142 and 242 are referred to as two-dimensional (2D) capacitors since they extend only in the directions parallel to the top surface of substrate 12 (if the thicknesses of capacitors 142 and 242 are not considered).

Figure 4:
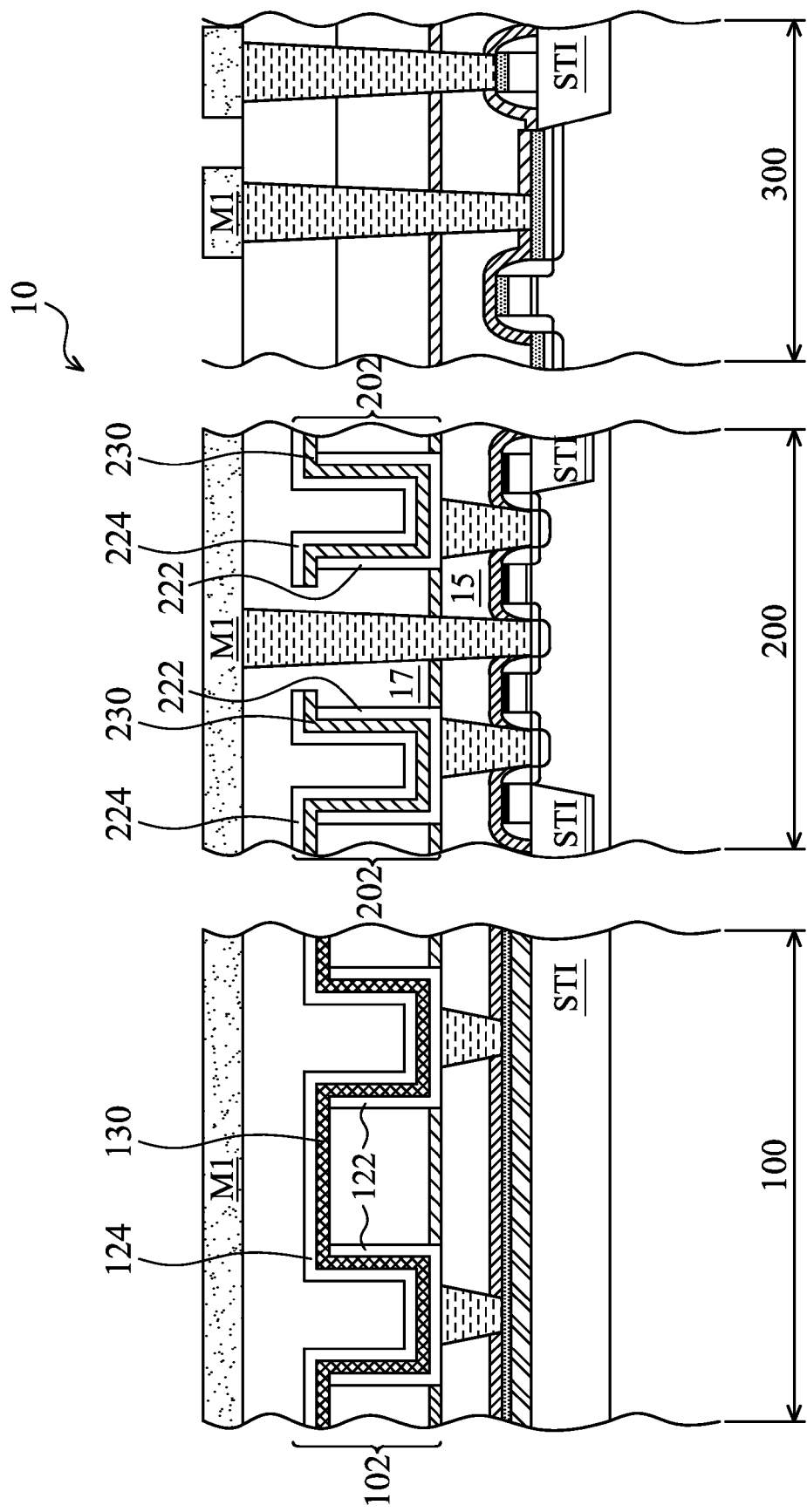

FIG. 4 illustrates yet another embodiment of the present invention, wherein like elements in FIGS. 1 and 4 are illustrated using like reference numerals. In FIG. 4, instead of forming both layers $130_1$ and $130_2$ as capacitor insulators of capacitor 102, only one layer of capacitor insulator 130 is formed, which is either formed of a different material, or has a different thickness, from capacitor insulator 230. In embodiments of the present invention, capacitor insulators 130 and 230 are referred to as being different from each other if they comprise at least one different material, or have different thicknesses in at least one of the sub layers. In other words, the capacitor insulators are different unless they have a same thickness and are formed of a same material. Therefore, in the above-discussed embodiments as shown in FIGS. 1 through 4, the capacitor insulators in regions 100 and 200 are all different.

With the capacitor insulators in regions 100 and 200 being different from each other, the insulators for each type of capacitor may be customized as needed, and hence the chip area occupied by the capacitors may be minimized without sacrificing the reliability (the endurance to the voltages) of the capacitors. This is particularly advantageous since both DRAM capacitors (for their big number) and decoupling capacitors may occupy large chip areas, thus being able to customize the insulators of capacitors 100 and 200 is important.

In addition, besides the above-discussed dual-dielectric capacitors, triple-dielectric capacitors may be formed. For example, region 100 may include a mixed signal region and an RF region, and the capacitors in the mixed signal region and the RF region may sustain different voltages. Two types of capacitors may thus be formed in region 100, wherein the two types of capacitor insulators of the capacitors in region 100 are different from each other, and may or may not be different from the capacitor insulator in region 200. As discussed in the preceding paragraphs, capacitor insulators are different if they are different in materials and/or are different in thickness. Accordingly, in the triple-capacitor-insulator schemes or other multi-capacitor-insulator schemes with even more capacitor insulator layers, different combinations of capacitor insulator layers may be made to minimize the process steps. However, at least the formation processes of the top electrodes and the bottom electrodes of different capacitors may be combined.

Figure 5:
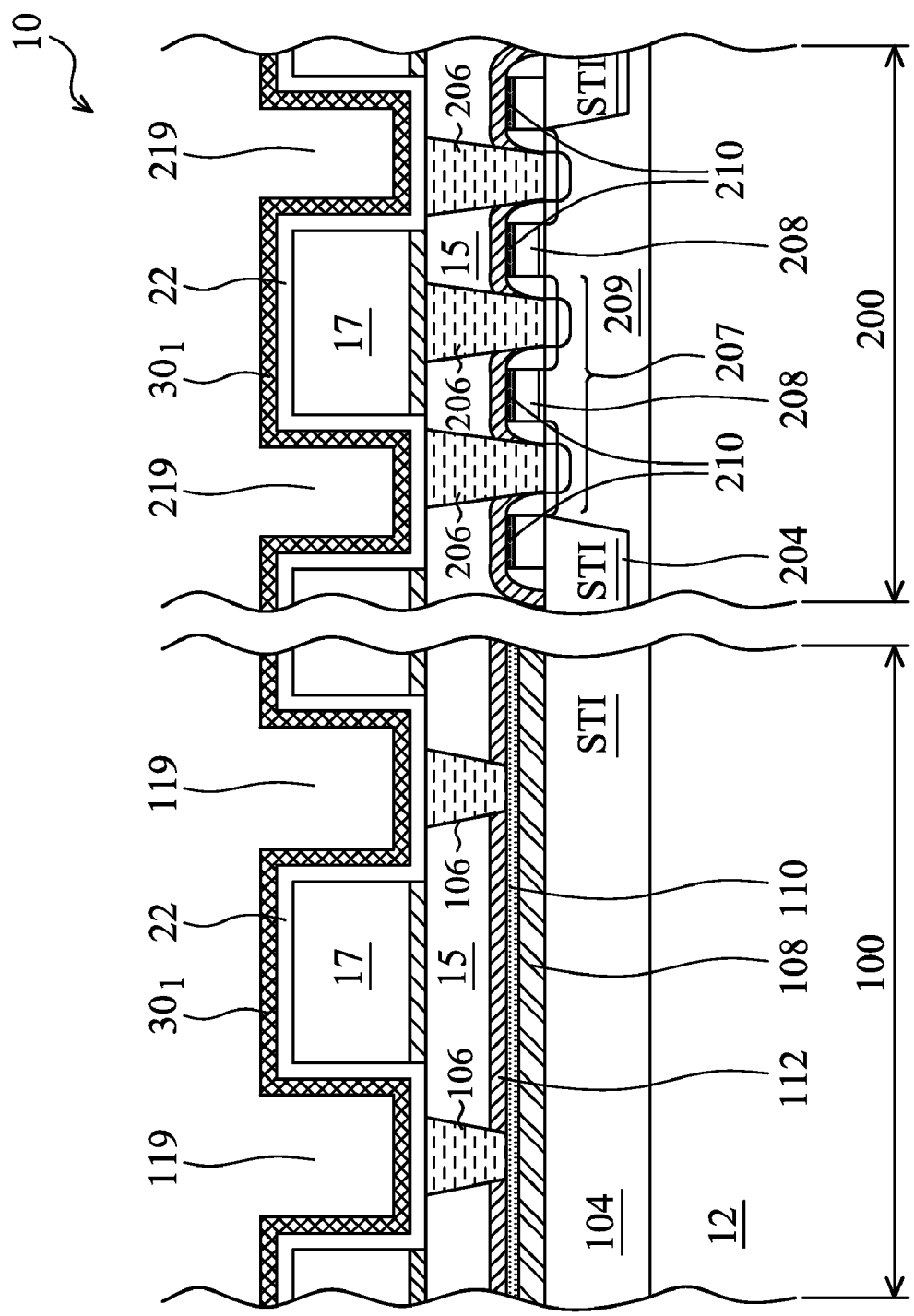
FIGS. 5 through 8 illustrate cross-sectional views of intermediate stages in the formation of an embodiment of the present invention.

FIGS. 5 through 8 illustrate cross-sectional views of intermediate stages in a brief process flow for forming the embodiment shown in FIG. 2. Referring to FIG. 5, transistor 207 is formed in well region 209. STI region 104 is also formed, for example, simultaneously with STI regions 204. Next, gates 208 and polysilicon strip 108 are formed, followed by the formation of silicides 110 and 210. Contact plugs 106 and 206 are then formed. First ILD 15 is formed, followed by the formation and patterning of second ILD 17. Openings 119 and 219 are then formed.

Figure 6:
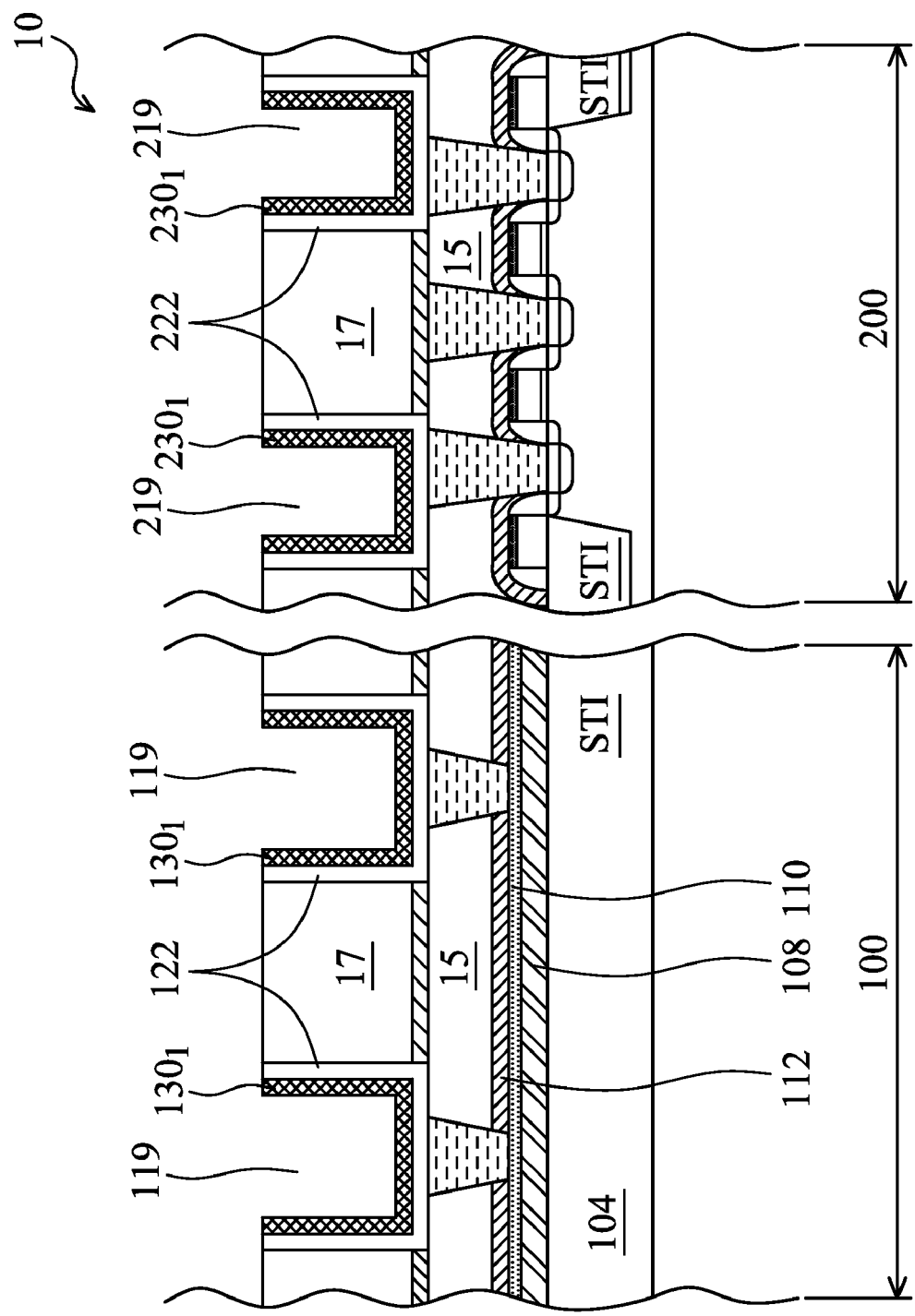

In an embodiment, bottom capacitor electrode layer 22 and first insulation layer $30_1$ are blanket deposited. Insulation layer $30_1$ may include high-k materials such as $TiO_2$, $HfO_2$, $Al_2O_3$, $ZrO_2$, and/or the like, and may be formed using atomic layer deposition (ALD) or other applicable methods. A CMP process is performed to remove portions of bottom capacitor electrode layer 22 and first insulation layer $30_1$ directly over ILD 17. The resulting structure after the CMP is shown in FIG. 6. The CMP may be assisted by filling openings 119 and 219 with a photo resist (not shown), and performing a CMP on the photo resist and layers 22 and $30_1$, so that any portion of the layers directly over ILD 17 is polished. The remaining portions of the photo resist in openings 119 and 219 are then removed. In alternative embodiments, the CMP is performed before the formation of insulation layer $30_1$, and hence in the final structure, the portion of insulation layer $30_1$ directly over ILD 17 remains. The respective embodiment is shown in FIG. 1.

Figure 7:
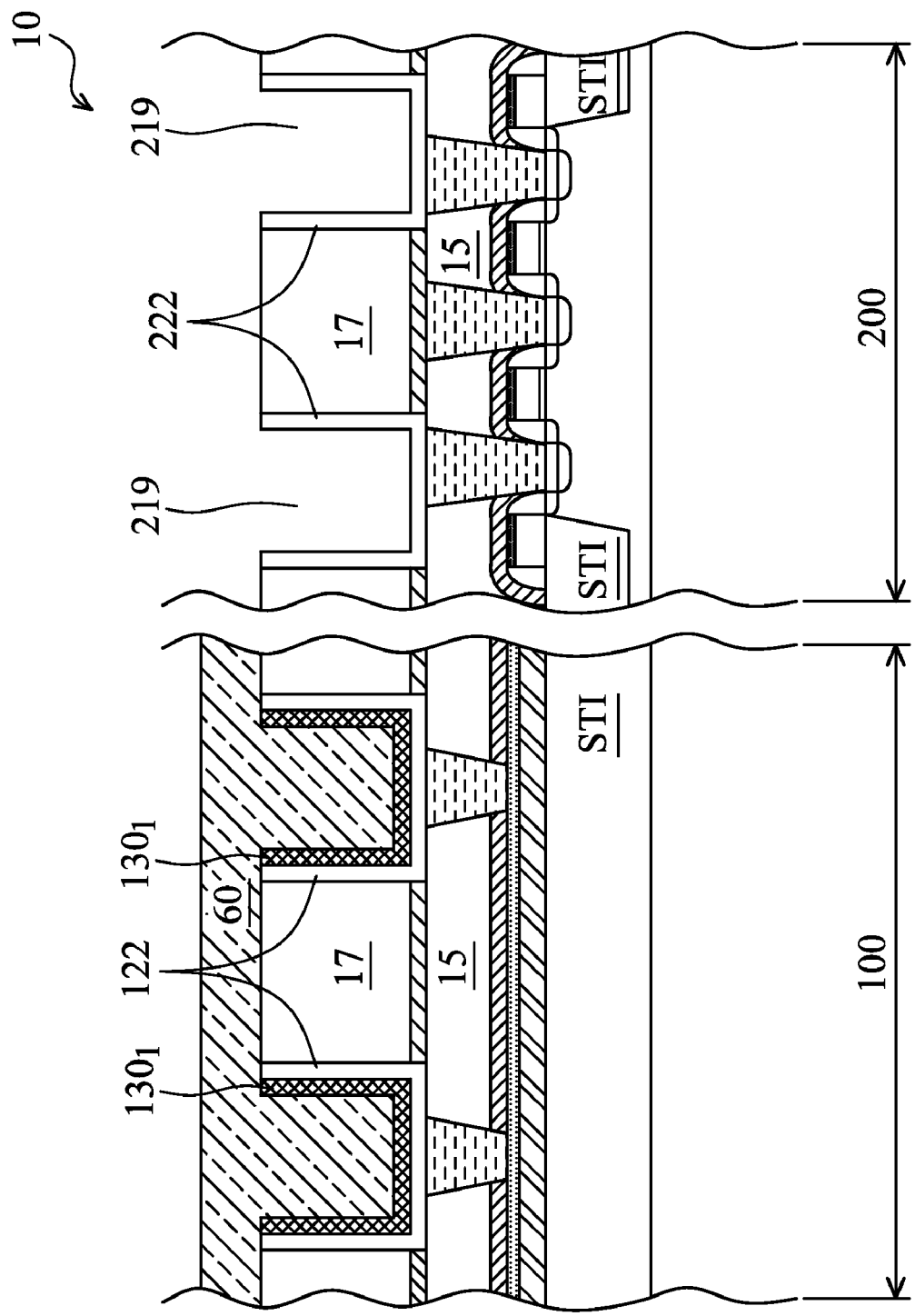
Figure 8:
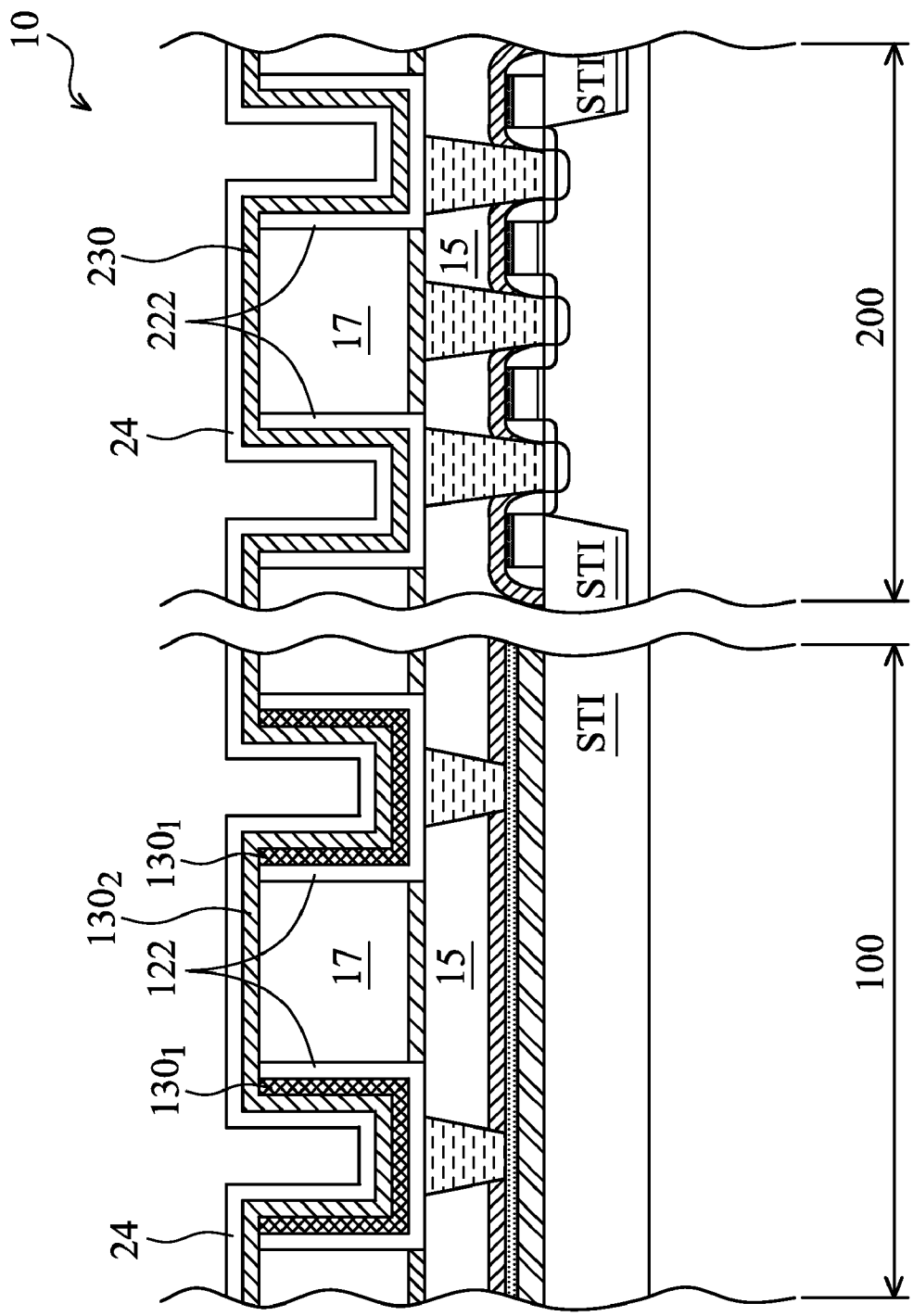

In FIG. 7, mask 60 is formed to cover region 100, so that portions $230_1$ (see FIG. 6) in region 200 may be etched, for example, by a wet etching process. Next, as shown in FIG. 8, mask 60 is removed, and an insulation layer (denoted as $130_2$ in region 100, and 230 in region 200) is formed. Insulation layer $130_2$ may also include high-k materials such as $TiO_2$, $HfO_2$, $Al_2O_3$, $ZrO_2$, and/or the like, which may be different from insulation layer $130_1$ in material and/or different in thickness. Next, top electrode layer 24 is deposited and patterned.

The embodiments of the present invention have several advantageous features. By integrating capacitors in different functional regions, the process steps and complexity for forming multiple functional capacitors are reduced. The reliability and chip-area usage of the capacitors, on the other hand, are improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
a chip comprising a first region and a second region;
a first metal-insulator-metal (MIM) capacitor in the first region, wherein the first MIM capacitor comprises:
a first bottom electrode;
a first top electrode over the first bottom electrode; and
a first capacitor insulator between and adjoining the first bottom electrode and the first top electrode; and
a second MIM capacitor in the second region and substantially level with the first MIM capacitor, wherein the second MIM capacitor comprises:
a second bottom electrode;
a second top electrode over the second bottom electrode; and
a second capacitor insulator between and adjoining the second bottom electrode and the second top electrode, wherein the second capacitor insulator is different from the first capacitor insulator, with the first capacitor insulator having a different thickness than the second capacitor insulator, or the first capacitor insulator and the second capacitor insulator comprising different materials.

2. The integrated circuit structure of claim 1, wherein the first capacitor insulator comprises a first layer and a second layer stacked together, and the second capacitor insulator comprises a layer having a same thickness as the first layer, and formed of a same material as the first layer, and wherein the second capacitor insulator does not comprise any dielectric layer having a same thickness as the second layer, and formed of a same material as the second layer.

3. The integrated circuit structure of claim 2 further comprising a third MIM capacitor in the first region and adjacent the first MIM capacitor, wherein the third MIM capacitor comprises:
a third bottom electrode connected to the first bottom electrode;
a third top electrode over the third bottom electrode and connected to the first top electrode; and
a third capacitor insulator between the third bottom electrode and the third top electrode, wherein the third capacitor insulator and the first layer of the first capacitor insulator form a continuous layer.

4. The integrated circuit structure of claim 3, wherein the third MIM capacitor further comprises a fourth capacitor insulator stacked with the third capacitor insulator, wherein the fourth capacitor insulator has a same thickness as the second layer, and is formed of a same material as the second layer, and wherein the fourth capacitor insulator and the second capacitor insulator are disconnected from each other.

5. The integrated circuit structure of claim 3, wherein the third MIM capacitor further comprises a fourth capacitor insulator stacked with the third capacitor insulator, wherein the fourth capacitor insulator has a same thickness as the second layer, and is formed of a same material as the second layer, and wherein the fourth capacitor insulator and the second capacitor insulator are connected to each other to form a continuous layer.

6. The integrated circuit structure of claim 2, wherein the first region is a region selected from a group consisting essentially of a mixed signal region, an analog region, and a radio frequency region, and wherein the second region is a dynamic random access memory region with the second MIN capacitor being a storage capacitor.

7. The integrated circuit structure of claim 1, wherein the first MIM capacitor and the second MIM capacitor are in an inter-layer dielectric (ILD), and wherein the integrated circuit structure further comprises a shallow trench isolation (STI) region directly underlying, and having an area substantially greater than, the first MIM capacitor.

8. The integrated circuit structure of claim 1, wherein the first MIM capacitor and the second MIM capacitor are three-dimensional capacitors.

9. The integrated circuit structure of claim 1, wherein the first MIM capacitor and the second MIM capacitor are two-dimensional capacitors.

10. An integrated circuit structure comprising:
a chip comprising a first region and a second region;
a first metal-insulator-metal (MIM) capacitor in the first region, wherein the first MIM capacitor comprises:
a first bottom electrode;
a first top electrode over the first bottom electrode; and
a first capacitor insulator between and adjoining the first bottom electrode and the first top electrode; and
a second MIM capacitor in the second region, wherein the second MIM capacitor comprises:
a second bottom electrode having a substantially same thickness as, and formed of a same material as, the first bottom electrode;
a second top electrode over the second bottom electrode, wherein the second top electrode has a substantially same thickness as, and is formed of a same material as, the first top electrode; and
a second capacitor insulator between and adjoining the second bottom electrode and the second top electrode, wherein the second capacitor insulator is different from the first capacitor insulator, with the first capacitor insulator having a different thickness than the second capacitor insulator, or the first capacitor insulator and the second capacitor insulator comprising different materials.

11. The integrated circuit structure of claim 10, wherein the first bottom electrode is substantially level with the second bottom electrode.

12. The integrated circuit structure of claim 11, wherein the first capacitor insulator comprises a first layer and a second layer stacked together, and the second capacitor insulator comprises a layer having a same thickness as the first layer, and formed of a same material as the first layer, and wherein the second capacitor insulator does not comprise any dielectric layer having a same thickness as, and formed of a same material as, the second layer.

13. The integrated circuit structure of claim 11 further comprising a shallow trench isolation (STI) region directly underlying, and having an area substantially greater than, the first MIM capacitor, wherein a substantial portion of the second MIM capacitor has no underlying STI regions.

14. The integrated circuit structure of claim 10, wherein the second region is a dynamic static random access memory region with the second MIM capacitor being a storage capacitor, and wherein the first capacitor insulator has a greater thickness than the second capacitor insulator.

15. The integrated circuit structure of claim 10, wherein the first capacitor insulator and the second capacitor insulator have different thicknesses and are formed of different dielectric materials.

16. The integrated circuit structure of claim 10, wherein the first MIM capacitor and the second MIM capacitor are three-dimensional (3D) capacitors.

17. An integrated circuit structure comprising:
a chip comprising a first region and a second region;
an inter-layer dielectric (ILD) extending from the first region into the second region;
a first metal-insulator-metal (MIM) capacitor in the first region and in the ILD, wherein the first MIM capacitor comprises:
a first bottom electrode;
a first top electrode over the first bottom electrode; and
a first capacitor insulator between and adjoining the first bottom electrode and the first top electrode;
a second MIM capacitor in the second region and in the ILD, wherein the second MIM capacitor is substantially level with the first MIM capacitor, and wherein the second MIM capacitor comprises:
a second bottom electrode;
a second top electrode over the second bottom electrode; and
a second capacitor insulator between and adjoining the second bottom electrode and the second top electrode, wherein the first capacitor insulator has a greater thickness than the second capacitor insulator; and
a shallow trench isolation (STI) region directly underlying, and having an area substantially greater than, the first MIM capacitor, wherein a substantial portion of the second MIM capacitor has no underlying STI regions.

18. The integrated circuit structure of claim 17, wherein the first capacitor insulator comprises a first layer and a second layer stacked together, and the second capacitor insulator comprises a layer having a same thickness as the first layer, and formed of a same material as the first layer, and wherein the second capacitor insulator does not comprise any dielectric layer having a same thickness as the second layer, and formed of a same material as the second layer.

19. The integrated circuit structure of claim 17, wherein the second MIM capacitor is a storage capacitor of a dynamic random access memory cell.

20. The integrated circuit structure of claim 17, wherein the first MIM capacitor is a decoupling capacitor.

21. The integrated circuit structure of claim 17, wherein the first MIM capacitor and the second MIM capacitor are three-dimensional (3D) capacitors.

* * * * *

UNITED STATES PATENT AND TRADEMARK OFFICE
CERTIFICATE OF CORRECTION

| | | |
|---|---|---|
| PATENT NO. | : 8,143,699 B2 | Page 1 of 1 |
| APPLICATION NO. | : 12/618021 | |
| DATED | : March 27, 2012 | |
| INVENTOR(S) | : Ching et al. | |

It is certified that error appears in the above-identified patent and that said Letters Patent is hereby corrected as shown below:

In Col. 8, line 2, claim 6, delete "MIN" and insert --MIM--.

Signed and Sealed this
Third Day of July, 2012

David J. Kappos
*Director of the United States Patent and Trademark Office*